United States Patent [19]

Snitzer et al.

[11] 4,275,965
[45] Jun. 30, 1981

[54] LONG STROKE, HIGH RESOLUTION OPTICAL POSITION SENSOR

[75] Inventors: Elias Snitzer, West Hartford; Donald E. Anschutz, Somers; Edward V. Fox, Jr, East Granby, all of Conn.

[73] Assignee: United Technologies Corporation, Hartford, Conn.

[21] Appl. No.: 68,374

[22] Filed: Aug. 21, 1979

[51] Int. Cl.³ .............................................. G01B 11/14
[52] U.S. Cl. .................... 356/375; 33/125 A; 250/237 G; 350/96.27
[58] Field of Search ............... 356/373, 375, 395, 396; 250/237 G, ; 33/125 A; 350/96.27

[56] References Cited

U.S. PATENT DOCUMENTS

| | | | |
|---|---|---|---|
| 3,141,106 | 7/1964 | Kapany | 350/96.27 |
| 4,011,448 | 3/1977 | Hordeski | 356/396 |
| 4,047,025 | 9/1977 | Lemelson | 250/237 G |
| 4,116,000 | 9/1978 | Martin et al. | 350/96.24 |

Primary Examiner—Richard A. Rosenberger
Attorney, Agent, or Firm—Dominic J. Chiantera

[57] ABSTRACT

A high resolution optical position sensor for measuring the linear displacement of a reciprocating device with a long stroke, includes a code plate having a substrate comprised of a fiber optic faceplate having a plurality of parallel optical waveguides which are fused together and aligned perpendicular to each of two major surfaces of the faceplate, and an optical mask with serial transparent and opaque regions encoded in each of a plurality of bit channels disposed on one of the two major surfaces of the faceplate, a portion of the plurality of optical waveguides being in registration with the transparent regions of each bit channel.

4 Claims, 6 Drawing Figures

LONG STROKE, HIGH RESOLUTION OPTICAL POSITION SENSOR

BACKGROUND OF THE INVENTION

1. Field of Invention

This invention relates to optical position sensors, and more particularly to fiber optic position sensors for measuring the linear displacement, or stroke, of a reciprocating device.

2. Description of the Prior Art

Fiber optic position sensors for measuring the present position of a reciprocating device to determine the particular displacement of the device within its stroke range at any given time, are known in the art. In general the position of the device is measured over the stroke through interruption of a light transmission path by an optical code plate having a selected code for providing a multiple bit signal value uniquely descriptive of the particular position within the stroke range. The resolution of the sensor is determined by the least significant bit (LSB) of the signal, which represents the minimum displacement to which the sensor may respond with a change in signal value.

The code plate comprises a metallized optical mask disposed through known photolithographic methods along one surface of a transparent substrate. The substrate is typically glass, and the mask is encoded on the glass with a series of transparent and opaque regions arrayed in a plurality of rows in a pattern determined by the code selected. Each row corresponds to one of the multiple bit channels providing the multiple bit optical signal. The bits extend from a most significant bit (MSB) to a least significant bit (LSB), and if a Gray code is selected for the mask, the bits provide sensed position information at a granularity which increases by a factor of two with each successive bit. The granularity of the LSB, which determines the maximum achievable resolution for the sensor, is determined by: Stroke Distance/$2^N$; where N equals the number of bit channels.

Typical of the prior art optical position sensors is that disclosed by U.S. Pat. No. 4,116,000 issued to Martin et al. and of common assignee herewith. As disclosed therein the light transmission path is established between a light transmitter and a light receiver disposed on either side of the code plate. The code plate is mechanically connected to the reciprocating device and moves in direct displacement therewith through the total stroke. The transmitter and receiver each include a plurality of light transmissive optic fibers, one associated with each of the bit channels of the code plate. The fibers of the transmitter and receiver associated with a common bit channel are in registration so as to permit light transmission therebetween. Since the light from each transmitting fiber diverges, the gap between the transmitter and receiver fibers establishes the spatial response distance of the sensor and also the degree of light detection error caused by light scattering and cross-talk within the substrate of the code plate. Therefore, in order to provide the maximum resolution the ends of the associated fibers of the transmitter and receiver must be placed as close as possible. As a result the code plates of the prior art sensors include very thin substrate material to ensure a minimum gap between the transmitter and receiver. This results in a fragile code plate structure which, while sufficient for measurement over a short stroke distance, is unsuitable for large stroke distances. In a high mechanical shock, or vibration environment, the longer stroke distances result in deformation of the code plate and, in the worst case, fracture of the plate resulting in catastrophic failure of the sensor.

For short stroke applications the substrate may be as thin as 250 microns with the metallized mask less than 1 micron. In order to provide a code plate having sufficient structural strength for use in the longer stroke applications the substrate thickness would have to be increased. This results in the increased occurrence of cross-talk, i.e. the light incident from the transmitting fiber of one bit channel being detected by the receiving fiber of the adjacent bit channel.

SUMMARY OF THE INVENTION

The object of the present invention is to provide a long stroke, high resolution optical position sensor for measuring the instant position of a reciprocating device over a long stroke distance.

According to the present invention, a long stroke high resolution optical position sensor includes a code plate having a substrate comprising a fiber optic faceplate, the faceplate including a plurality of transmissive fiber optic cores arrayed in parallel between two major surfaces of the faceplate, each fiber core being encased along its circumferential length by an optical cladding material having a lower index of refraction than the core, the cores with cladding thereon providing a plurality of parallel optical waveguides extending between the two major surfaces of the faceplate, the code plate further including an optical mask disposed on one of the two major surfaces of the faceplate and encoded with a plurality of transparent and opaque regions arrayed in a selected code in each of a plurality of rows corresponding to bit channels, the mask being disposed on the faceplate to provide registration of each transparent region with a portion of the plurality of waveguides therein, the code plate being adapted for linear displacement through a light transmission path in direct equivalence to that of the device, the transmission path being established between a light transmitter and a light receiver disposed on either side of the code plate, each having an equal plurality of optical waveguides, one associated with each bit channel, the waveguides of the transmitter and receiver associated with a common bit channel being disposed in registration with the bit channel and with each other to provide, in dependence on the presence of a mask transparent therebetween, a completed light transmission path region thereof, through the optical waveguides of the faceplate coincident with the particular transparent region, each faceplate optical waveguide providing through total internal reflection the transmission of light incident at one end from the light transmitter to the other end thereof adjacent the light receiver. In further accord with the present invention, the fiber optic faceplate includes a lesser plurality of light absorbing fiber cores interposed with the plurality of light transmissive fiber cores for attenuating by absorption stray light incident thereon. In still further accord with the present invention, the code plate substrate comprises a laminated structure of layers of fiber optic faceplate having both light transmissive and light absorbing fiber cores each encased with a lower index of refraction cladding material, interposed with light absorbing layers and the light absorbing layers being coextensive with the opaque region of the mask between adjacent bit channels, the light transmissive paths being coextensive with the transparent regions of the mask.

The improved optical position sensor of the present invention provides a code plate having a substrate comprising a fiber optic faceplate which includes a plurality of optical waveguides for providing defined propagation paths therethrough, such that the substrate may be made sufficiently thick to provide the code plate with sufficient mechanical strength for use in measuring the displacement of a movable device over a long stroke interval, while providing simultaneously a high resolution accuracy in optical position measurement. The code plate provides the highest degree of optical isolation between adjacent bit channels through the use of a fiber optic faceplate having a plurality of light absorbing fiber cores interspersed among the plurality of light transmissive fiber cores, which attenuate stray light within the substrate.

These and other objects, features and advantages of the present invention will become more apparent in light of the following detailed description of exemplary embodiments thereof, as illustrated in the accompanying drawing.

DETAILED DESCRIPTION

Figure 1:
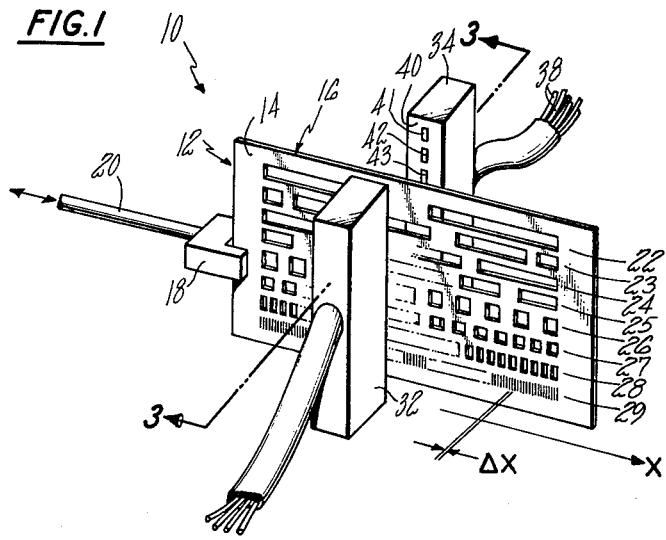
FIG. 1 is a perspective illustration of a typical optical position sensor.

Referring now to FIG. 1, a typical optical position sensor 10 includes a code plate 12 having an optical mask 14 disposed along one surface of a transparent substrate 16. The code plate is attached through a suitable mechanical connector 18 and shaft 20 to the movable device whose position is to be sensed, thereby allowing the code plate to be displaced with direct equivalence to that of the device. The mask 14 is encoded with the selected code, such as the Gray code, to provide a sequence of the transparent and opaque regions in each of a plurality of rows, each row corresponding to one of a plurality of bit channels of information. For the position sensor of FIG. 1 the code plate mask is illustrated as having eight bit channels 22–29, from the MSB represented by bit channel 22 to the LSB of bit channel 29.

The code plate moves with the device along a displacement axis X through an optical, light transmission path established between a light transmitter 32 and a light receiver 34. The transmitter and receiver each include a plurality of optic fibers 36, 38 which are terminated at one end in a vertical array along the face of the transmitter (not shown) and the face 40 of the receiver adjacent the associated one of the two major surfaces of the code plate. The fibers 36, 38 include one for each of the bit channels 22–29, with common bit channel fibers of the transmitter and receiver being in registration with each other and with the associated bit channel. FIG. 1 illustrates the terminations 41–43 for three of the receiver fibers 38 at the face 40, which are in registration with associated ones of the bit channels 22–24. The other end of the fibers 36 are connected to a light source (not shown) which may comprise one or more light emitting diodes (LED) connected individually to each fiber, or a single LED connected in common to the bundle of fibers, such that the emitted light from the source is piped through the fibers to the face of the transmitter. The receiving fibers 38 are terminated at the other end in individual detectors (not shown). In operation the displacement of the code plate through the light transmission path established between the transmitter 32 and receiver 34 causes the periodic interruption of the light transmission through each of the bit channels, in dependence on the present location of a transparent or opaque portion of the bit channel being disposed at that instant in the light path. For the preferred Gray code, the transition of the illustrated eight bit channel array occurs in single bit increments, i.e. in each displacement increment ($\Delta x$) along the axis of displacement (X) only one of the eight bit channels changes the state of its transparent or opaque region within the light transmitting path.

Figure 2:
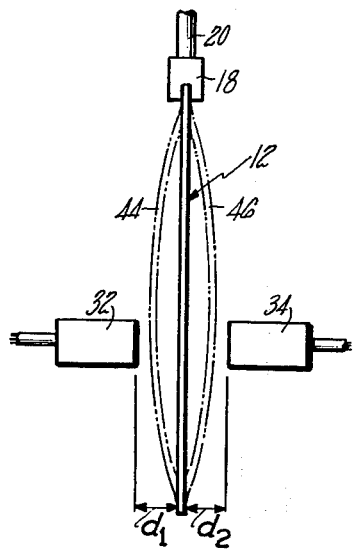
FIG. 2 is an illustration of the top view of the position sensor of FIG. 1.

As described thus far the optical position sensor of FIG. 1 is equally descriptive of position sensors known in the art as well as the optical position sensor of the present invention. The point of departure of the optical position sensor of the present invention from that known in the art is the code plate assembly 12. As described hereinafter the code plate of the present invention overcomes the limitations of the prior art devices with respect to insufficient mechanical strength and resolution accuracy for long stroke applications. To better understand the prior art limitations, FIG. 2 illustrates a top view of the optical position sensor of FIG. 1 with a prior art code plate. Since the length of the code plate must equal the stroke distance of the device, the longer the thin dimensioned substrate the more fragile the construction of the code plate. This allows the plate to deform with vibration or mechanical shock. The lateral displacement of the code plate is shown by the phantom lines 44, 46. The magnitude of the lateral displacement of the plate resulting from deformation, together with the thickness of the code plate and any added manufacturing tolerances, establishes the required gap distance between the faces of the transmitter and receiver. As the gap distance increases the length of the light transmission path similarly increases resulting in the reduction of sensor resolution due to light scattering and the possibility of cross-talk between channels, and an increase in the spatial response distance which reduces the spatial response of the sensor. Although some degree of lateral displacement may be acceptable in certain applications, for the long stroke applications where there exists the possibility of severe deformation or fracture, a code plate having a greater mechanical rigidity is required.

Figure 3:
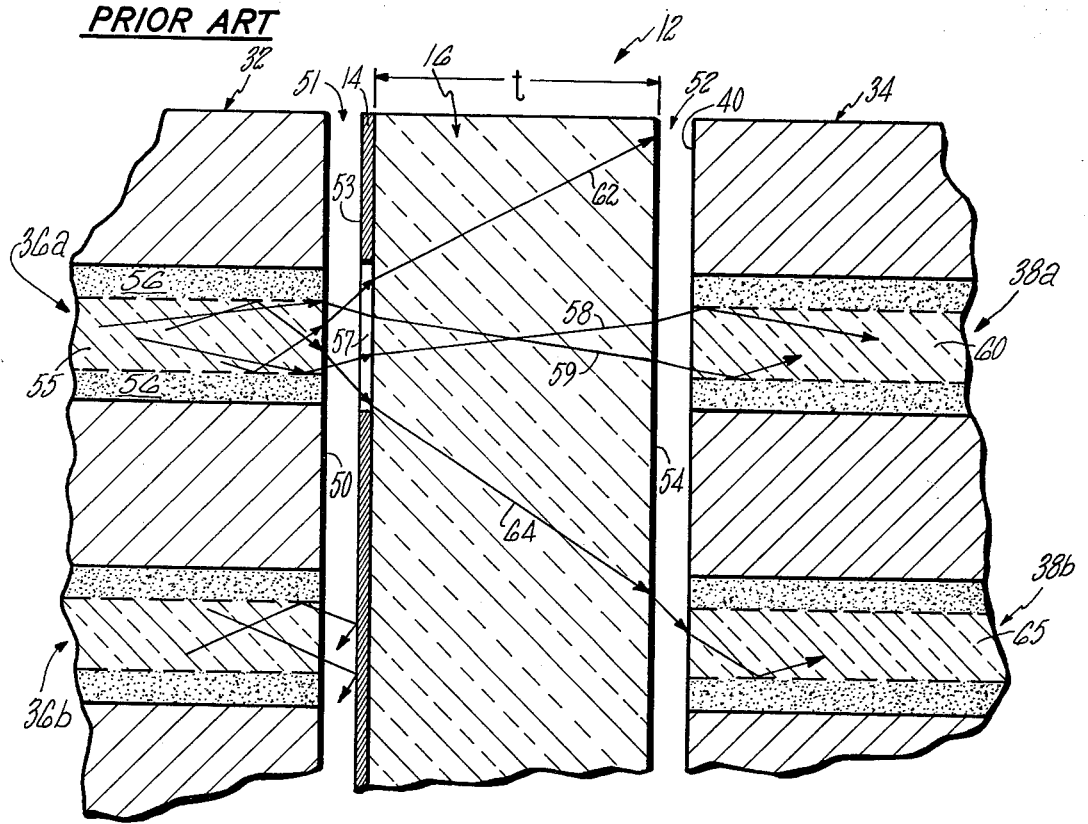
FIG. 3 is a partial sectioned view, taken along the line 3—3 of FIG. 1, of a prior art code plate as used in the position sensor of FIG. 1.

One obvious way of reducing deformation of the code plate is to increase the substrate thickness. This, however, results in the further increase of the gap distance between the transmitter and receiver, increasing the light transmission path distance and further increasing the possibility of cross-talk between adjacent channels. FIG. 3 illustrates a partial section, taken along the line 3—3 of FIG. 1, of the position sensor of FIG. 1 with a prior art code plate 12 having a substrate 16 with thickness (t). The coating thickness of the mask 14 is insignificant in comparison with that of the substrate. Two transmitting fibers 36$_a$, 36$_b$ and two receiving fibers 38$_a$, 38$_b$ are shown within a section of the transmitter 32 and receiver 34. The mating faces 50 of the transmitter and 40 of the receiver are each displaced by gaps 51, 52 from the associated surfaces 53, 54 of the code plate 12. The transmitting and receiving optic fibers 36, 38 are identical and each include, as illustrated by the fiber 36$_a$ a core portion 55 which is encased along its circumferential length by a lower optical density cladding material 56 having a lower index of refraction than that of the core, such that light introduced into the fiber from the light source is piped by total internal reflection within the fiber to the transmitting surface 50.

The light emitted from the transmitting fibers, such as the fiber 36$_a$, diverge from the surface 50 at various angles up to some maximum angle determined by the indices of refraction of the core 55 and cladding 56, to provide a pattern of light rays which propagate across the gap 51. Assuming that for a particular position of the code plate the bit channel associated with the fiber 36$_a$ provides a transparent region 57 through the mask 14 and the adjacent bit channel associated with the fiber 36$_b$ provides an opaque region. The light rays from the fiber 36$_a$ are incident on the surface 54 in the transparent region at various angles of incidence and are refracted into the substrate 16 at angles of refraction determined by the indices of refraction of the glass substrate 16 and the medium of the gap. For rays 58, 59 the light propagation path is within the light transmission path, i.e. that area in the substrate which is in registration with the transmit fiber 36$_a$ and receiving fiber 38$_a$, such that the rays when emitted from the substrate surface 54 propagate across the gap 52 and are incident within the core 60 of the receiving fiber 38$_a$. The rays are then piped within the core to the associated light detector. The light rays 62, 64, which have a greater angle of incidence at the transparent region surface 56, diverge out of the light transmission path and are not received by the fiber 38$_a$. If the angle of divergence of a ray is great enough, such as that of the ray 64, it exits the surface 55 of the substrate and is incident at the core 65 of the receiving fiber 38$_b$ of the adjacent bit channel. If, as shown, the instantaneous position of the code plate is such that this next adjacent bit channel is not light transmissive for the particular, instant position value, then the incident ray 64 provides an error in the encoded optical signal. The degree of cross-talk is directly dependent on the magnitude of the substrate thickness, such that the greater the thickness required for structural rigidity the higher the incidence of cross-talk, with the encumbant loss in resolution.

In the optical position sensor of the present invention the code plate includes a substrate comprising a fiber optic faceplate having a plurality of light transmissive fiber optics each of which function as individual optical waveguides for piping the transmitted light through the substrate within the confined propagation path of the waveguide geometry. Fiber optic faceplates suitable for use in the code plate of the present invention are known in the art and available from such manufacturers as Incom, Inc., Southbridge, Mass., or American Optical Corporation, Southbridge, Mass.

Figure 4:
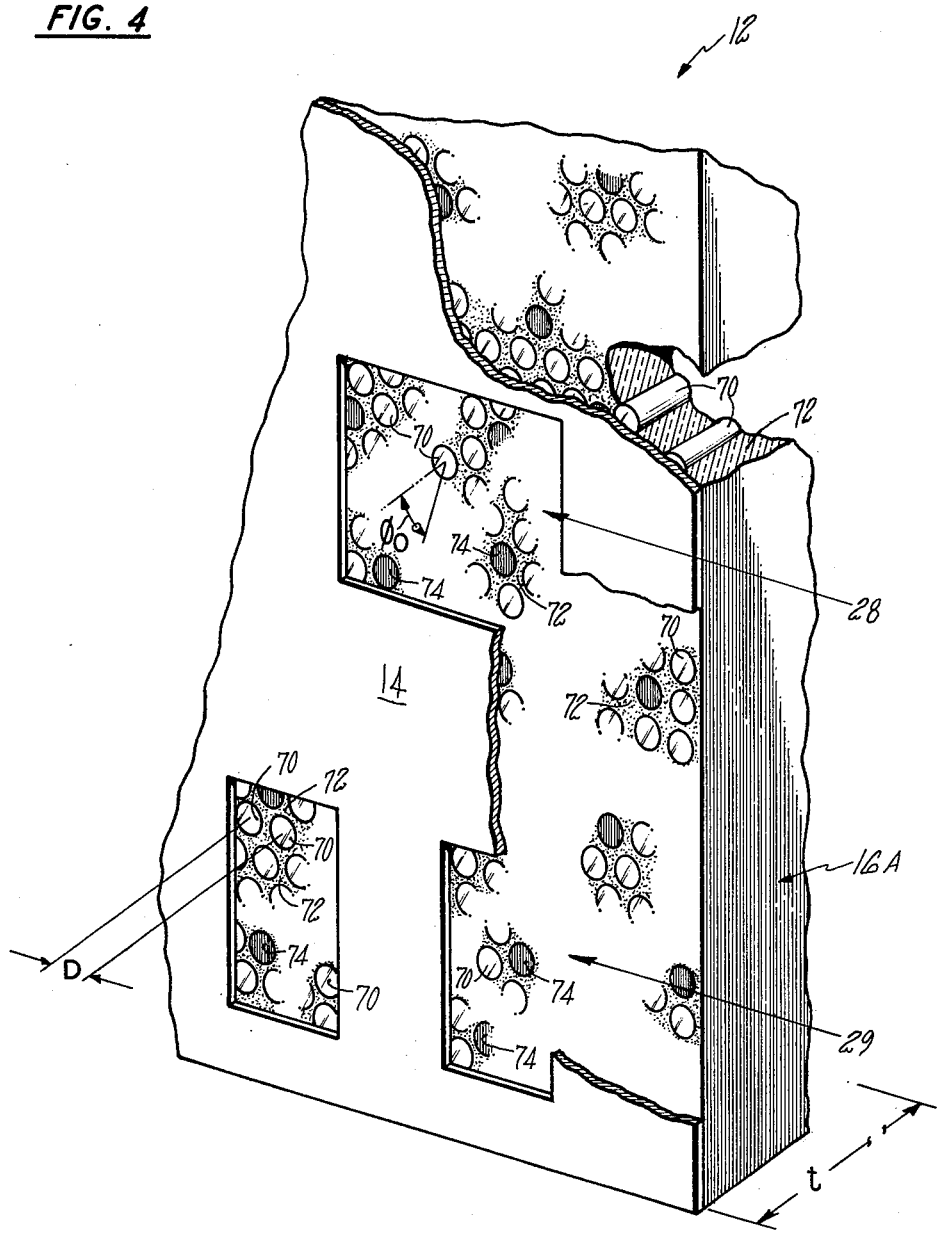
FIG. 4 is a perspective illustration, partly in section, and partly cutaway, of a portion of the code plate of the present invention.

Referring to FIG. 4, in a partial section, partial cutaway perspective illustration of a code plate 12$_a$ according to the present invention, the mask 14 is disposed on one of two major surfaces of a fiber optic faceplate 16$_a$. The faceplate comprises a plurality of parallel, light transmissive optic fiber cores 70 disposed in a lower optical density cladding material 72 within the transparent regions of each of the bit channels, as illustrated for the LSB bit channel 29 and the next to least significant bit channel 28 (FIG. 1). The parallel light transmissive fiber cores are fused within the faceplate cladding material 72 which has a lower index of refraction than the optic fiber cores and which encases each core along its entire circumferential length. The light transmissive cores comprise silicate glass cores of a type known in the art, such as SCHOTT ® F2 glass. The lower optical density medium used for the cladding 72 may comprise KIMBALL GLASS ® type R6 glass, with typical indices of refraction being n$_1$=1.62 for the core and n$_2$=1.52 for the cladding.

The optic fiber cores 70 encased within the cladding material 72 provide a plurality of parallel waveguides which extend through the faceplate, the length of each waveguide being equal to the other and equal to the thickness of the optical faceplate as used for the substrate. The terminations of the transmissive fiber cores at each of the two major surfaces of the faceplate are fused at each of the fiber ends. With the lower index of refraction cladding the transmissive fiber cores provide a piping through the fiber by total internal reflection of the light presented to the end of the fibers adjacent to the light transmitter at angles of incidence less than the critical angle, as determined by the numerical aperture (NA) of the waveguide. As known, the numerical aperture defines the limiting angle ($\phi_o$) of rays incident on the end of the fiber and through the core center, which propagate by total internal reflection down the core. The angle being determined by the indices of refraction of the core (n$_1$), the cladding (n$_2$) and the index of refraction (n$_o$) of the material in front of the fiber as:

$$NA = n_0 \sin\phi_0 = (n_1^2 - n_2^2)^{\frac{1}{2}}.$$

In the case of an air gap n$_o$=1.

Since the fiber cores can provide total internal reflection only for those incident rays at an angle less than that of the critical angle, for those rays incident on the surface of the light transmissive cores at angles greater than the value of $\phi_o$, a portion of the light is refracted into the cladding material 72. Similarly, some of the rays emitted from the transmitting fibers are directly incident on the cladding material itself. In either case, the light refracted into the cladding will propagate nonaxially through adjacent light transmissive fibers creating a possibility of cross-talk. To prevent this stray light within the fiber optic faceplate, a lesser plurality of light absorbing fiber cores 74 are also embedded in the faceplate, interposed with the light transmissive fiber cores. These light absorbing cores, which are known in the art, include light absorbing constituents to absorb the stray light which is refracted into the cladding, whether by direct incidence from the transmitter or indirectly from the cores, thereby preventing this light from walking across the array.

Figure 5:
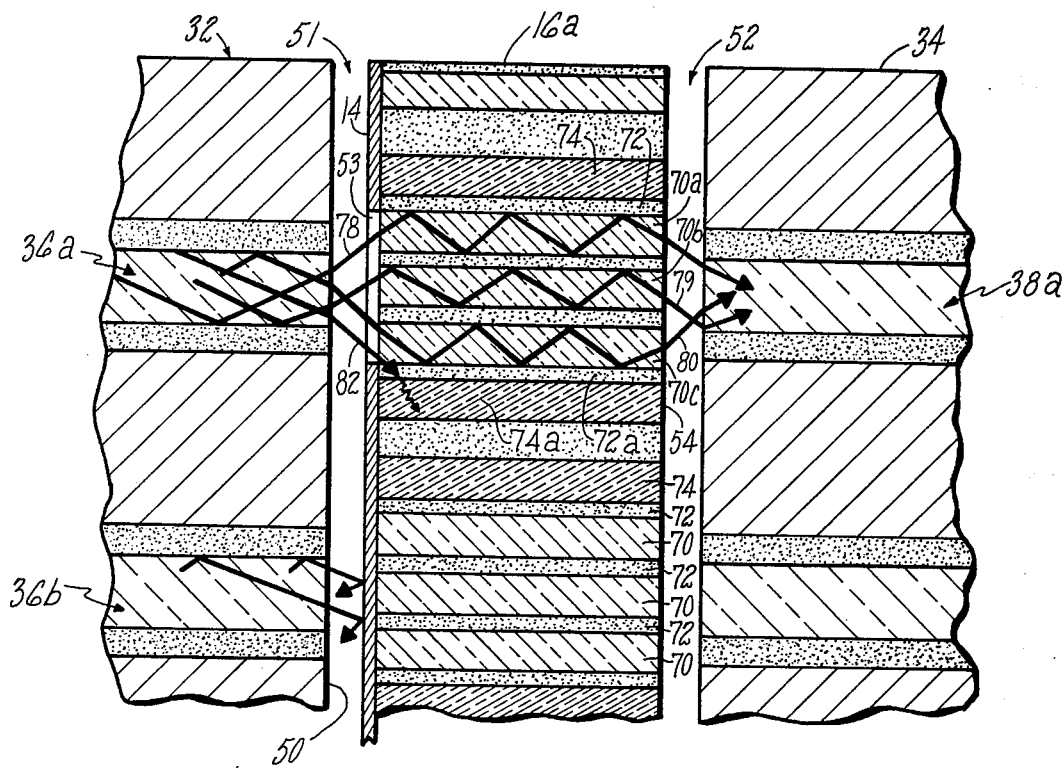
FIG. 5 is a partial sectioned view, taken along the line 3—3 of FIG. 1, of the code plate of FIG. 4 as used in accordance with the present invention in the position sensor of FIG. 1.

Referring now to FIG. 5, in a partial section, taken along the line 3—3 of FIG. 1, of an optical position sensor according to the present invention, the code plate includes a substrate $16_a$ comprising a fiber optic faceplate with light transmissive cores 70, cladding material 72, and light absorbing cores 74. For the same bit channel conditions as illustrated in FIG. 3, the light emitted from the transmitting fiber $36_a$ impinges on the surface 53 of the transparent region of the associated bit channel. Light rays 78–80 have incident angles less than the limiting angle defined by the numerical aperture, such that each is piped through one of the plurality of transmissive cores $70_a$–$70_c$ to the surface 54 of the substrate. Each of the rays propagate through the gap 52 and are incident on the core surface of the receiving fiber $38_a$. For the ray 82 emitted from the transmitting fiber $36_a$ at a greater angle of divergence, such that it is incident on the surface 54 either at an angle greater than the limiting angle $\phi_o$ for total internal reflection in the core or is incident directly on the cladding material $72_a$, the ray is refracted from the cladding into adjacent fibers until it is trapped within one of the light absorbing cores, such as the core $74_a$, which attenuates the stray light. In this manner the adjacent bit channel is isolated from cross-talk radiation. This isolation is provided by the plurality of light transmissive cores 70 associated with the particular light transmission path which contain the incident transmitted light having angles less than $\phi_o$ within the confines of each core region, thereby establishing definite propagation paths through the substrate. Further isolation is provided by the lesser plurality of light absorbing fibers which attenuate any scattered light which may occur by refraction from the cores 70 or by direct incidence on the cladding material 72.

Figure 6:
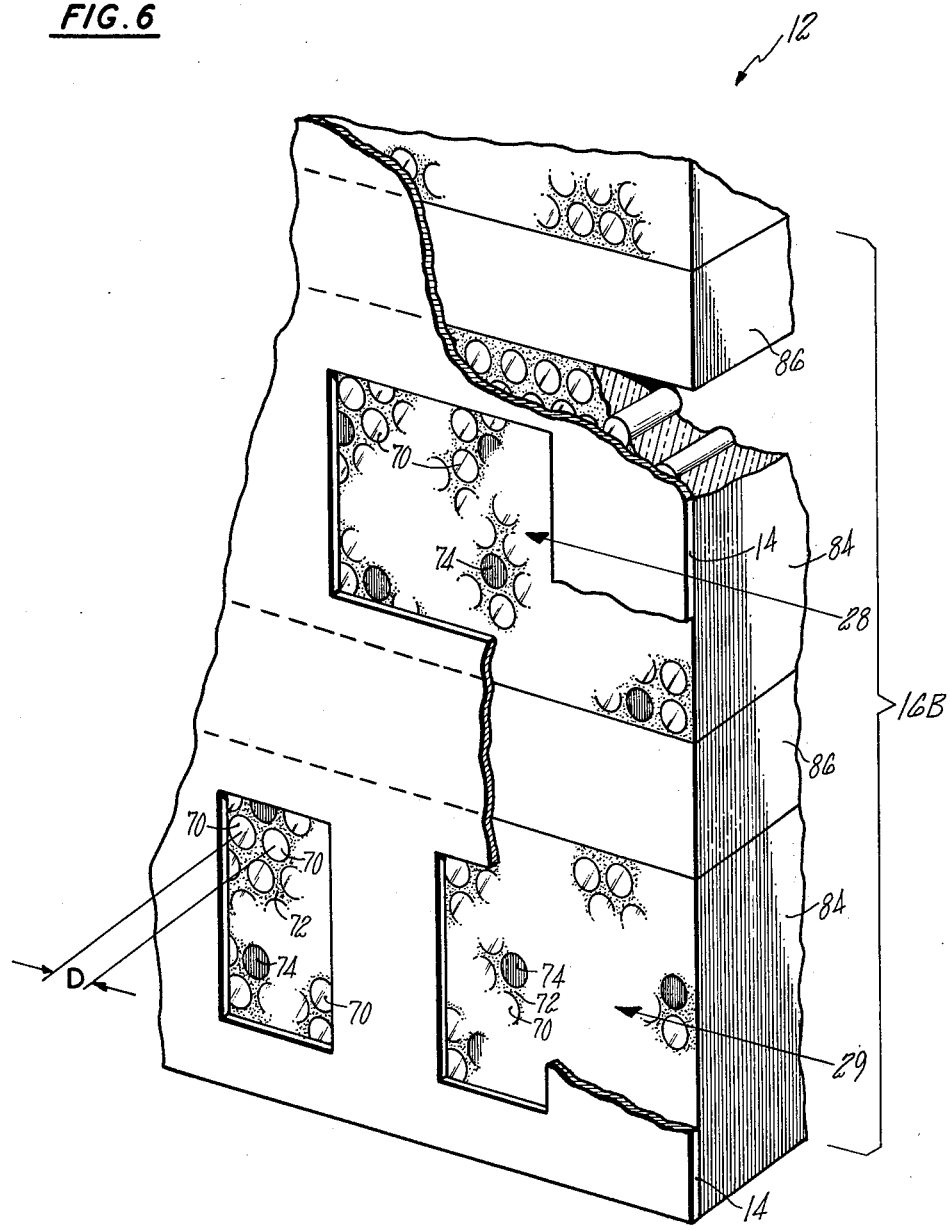
FIG. 6 is a perspective illustration, partly in section and partly cutaway, of a portion of an alternative embodiment of the code plate of FIG. 4, in accordance with the present invention.

In an alternative embodiment of the code plate for the optical position sensor according to the present invention, the substrate may comprise a laminated structure of alternative layers of fiber optic faceplate material and light absorbing material similar to that of the light absorbing fiber cores 74. Referring to FIG. 6, the fiber optic faceplate material is provided along the regions of the substrate coextensive with each of the bit channels to ensure that the plurality of light transmissive fibers (optical waveguides) are coincident with the transparent regions of each of the bit channels. Light absorbing material in the form of slabs 86 are interposed with the fiber optic faceplate portions in the region of the substrate which is in registration with the opaque portions of the mask between the bit channels. These glass absorbing layers provide further optical insulation between adjacent bit channels by providing an absolute light attenuation barrier therebetween. The laminated structure provides further optical isolation between channels for those applications requiring the highest degree of resolution, and its use depends on the particular application of the sensor.

In the code plate of the present invention, the light transmissive fibers are disposed within the cladding material 72 to provide a center-to-center dimension between adjacent light transmissive fibers which is less than one-half the width of the LSB provided on the mask 14. For a stroke of three and one half inches on a 12 bit channel mask, the resolution accuracy of the position measurement is equal to:

$$3.5 \text{ inches}/2^{12} = 0.856 \times 10^{-3} \text{ inches}, \qquad \text{Eq. (3)}$$

or 21.4 μm.

This represents the maximum resolution of the LSB and, to ensure uniformity in response for the different transparent regions, the approximate maximum center-to-center diameter between adjacent fiber cores. Depending on the accuracy requirements the center-to-center diameter spacing between adjacent cores may vary anywhere in the range of 3 to 100 microns.

The particular silicate glass used for the light transmissive cores depends upon the particular application of the sensor, and similarly the cladding material used in conjunction with the core fiber must have an index of refraction which is less than that of the core to ensure that the incident light on the transparent region of the code plate is piped through the substrate to the receiving fibers 38 of the receiver 34. The waveguiding provided by the light transmissive cores encased with the lower index of refraction cladding in combination with the interspersed light absorbing cores of the faceplate effectively eliminate the cross-talk problem between adjacent bit channels, such that the substrate thickness may be made as large as necessary to ensure the requisite mechanical rigidity of the code plate for use with long stroke applications. Where even further assurance of optical isolation between adjacent channels is required the substrate may comprise a laminated structure of fiber optic faceplate portions interleaved with light absorbing material located on the substrate between the adjacent bit channels. This provides, in combination with the optical fiber faceplate having the light absorbing fibers, the ultimate optical isolation between channels which may be necessary in high accuracy applications, such as airborne control systems. Similarly, although the invention has been shown and described with respect to illustrated embodiments thereof, it should be understood by those skilled in the art that the foregoing and various other changes, omissions and additions in the form and detail thereof may be made therein without departing from the spirit and the scope of the invention.

Having thus described typical emboiments of our invention, that which we claim as new and desire to secure by Letters Patent is:

1. An improved optical position sensor of the type which includes a code plate adapted for movement, in unison with the displacement of a reciprocating device whose position is to be measured, through a light transmission path established between the matching surfaces of a light transmitter and a light receiver spaced therefrom at a first dimension, the code plate including a substrate with an optical mask disposed thereon, the mask encoded with a plurality of transparent and opaque regions arrayed along each of a plurality of bit channels, the transmitter and receiver each including an optical waveguide associated with each bit channel to provide, in combination with a light emitting source and a light detecting source connected thereto, an encoded optical signal for each bit channel in dependence on the position of a transparent region or an opaque region therebetween, the improvement comprising:

a code plate having a substrate comprising a fiber optic faceplate, said faceplate having two major surfaces relatively spaced at a dimension selected in dependence on the first dimension, each parallel to an associated one of the surfaces of the transmitter and receiver, said faceplate including a plurality of adjacent transmissive fiber optic cores disposed in parallel between said major surfaces, each of said cores being encased along the circumferential length thereof with an optical cladding material having a lower index of refraction than said cores to provide a plurality of parallel optical waveguides through said substrate, each waveguide providing a light transmission path therethrough from one end thereof at said major surface adjacent the transmitter to the other end thereof at said major surface adjacent the receiver, said code plate further including an optical mask encoded with a plurality of transparent and opaque regions in each of a plurality of bit channels, said mask being adapted for disposal on one of said two major surfaces of said faceplate to provide registration of each of said transparent regions with a portion of said plurality of optical waveguides therein.

2. The optical position sensor of claim 1, wherein the centers of said adjacent fiber optic cores are spaced relative to each other at a center-to-center spacing in the range of from three microns to one hundred microns.

3. The optical position sensor of claim 1, wherein said optic fiber faceplate further includes a plurality of light absorbing fiber cores disposed in parallel between said major surfaces interposingly with said plurality of light transmissive fiber cores, each of said light absorbing cores being encased along the circumferential length thereof in said optical cladding material and each having an index of refraction greater than that of said cladding, whereby said light absorbing cores provide attenuation of light incident thereon.

4. An improved optical position sensor of the type which includes a code plate adapted for movement, in unison with the displacement of a reciprocating device whose position is to be measured, through a light transmission path established between the matching surfaces of a light transmitter and a light receiver spaced therefrom at a first dimension, the code plate including a substrate with an optical mask disposed thereon, the mask encoded with a plurality of transparent and opaque regions arrayed along each of a plurality of bit channels, the transmitter and receiver each including an optical waveguide associated with each bit channel to provide, in combination with a light emitting source and a light detecting source connected thereto, an encoded optical signal for each bit channel in dependence on the position of a transparent region of an opaque region therebetween, the improvement comprising:

a code plate having a laminated substrate comprising a plurality of alternate layers of fiber optic faceplate material and light absorbing material arranged in pairs, one pair associated with each bit channel, said laminated substrate having two major surfaces relatively spaced at a dimension selected in dependence on the first dimension, each parallel to an associated one of the surfaces of the transmitter and receiver, said optic faceplate material including a plurality of transmissive fiber optic cores and a plurality of light absorbing fiber cores disposed interposingly in parallel between said major surfaces, each of said plurality of cores being encased along the circumferential length thereof with a lower index of refraction cladding material, said light transmissive cores with said cladding comprising a plurality of parallel optical waveguides for providing a light transmission path through said substrate from said major surface adjacent the transmitter to said major surface adjacent the receiver, and said light absorbing cores providing attenuation of light incident thereon, said code plate further including an optical mask encoded with a plurality of transparent and opaque regions in each of a plurality of adjacent bit channels, each of said bit channels being separated from adjacent bit channels by an opaque region, said mask being adapted for disposal on one of said two major surfaces of said laminated substrate to provide registration of the transparent regions in each of said bit channels with the fiber optic faceplate material layer of the associated layer pair and registration of the opaque region between bit channels with the light absorbing layer of the associated layer pair.

* * * * *

UNITED STATES PATENT AND TRADEMARK OFFICE
CERTIFICATE OF CORRECTION

PATENT NO. : 4,275,965
DATED : June 30, 1981
INVENTOR(S) : Elias Snitzer, Donald E. Anschutz, and Edward V. Fox It is certified that error appears in the above—identified patent and that said Letters Patent is hereby corrected as shown below:

Column 7, line 36 "alternative" should be --alternate--.

Column 7, line 48 "insulation" should be --isolation--.

Column 8, line 38 "emboiments" should be --embodiments--.

Signed and Sealed this

Twenty-seventh Day of July 1982

[SEAL]

Attest:

GERALD J. MOSSINGHOFF

Attesting Officer

Commissioner of Patents and Trademarks